(12) United States Patent
Lee et al.

(10) Patent No.: US 12,286,707 B2
(45) Date of Patent: Apr. 29, 2025

(54) APPARATUS FOR MANUFACTURING SEMICONDUCTOR DEVICE

(71) Applicant: SAMSUNG ELECTRONICS CO., LTD., Suwon-si (KR)

(72) Inventors: Joonmyoung Lee, Gwacheon-si (KR); Whankyun Kim, Seoul (KR); Jeongheon Park, Hwaseong-si (KR); Junho Jeong, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 138 days.

(21) Appl. No.: 17/487,088

(22) Filed: Sep. 28, 2021

(65) Prior Publication Data

US 2022/0127716 A1 Apr. 28, 2022

(30) Foreign Application Priority Data

Oct. 28, 2020 (KR) .......................... 10-2020-0141325

(51) Int. Cl.
*C23C 14/56* (2006.01)
*C23C 14/08* (2006.01)
(Continued)

(52) U.S. Cl.
CPC .......... *C23C 14/568* (2013.01); *C23C 14/081* (2013.01); *C23C 16/403* (2013.01);
(Continued)

(58) Field of Classification Search
None
See application file for complete search history.

(56) References Cited

U.S. PATENT DOCUMENTS 5,096,364 A * 3/1992 Messer .................. H01L 21/67
414/217
5,695,564 A * 12/1997 Imahashi .......... H01L 21/67161
414/217
(Continued)

FOREIGN PATENT DOCUMENTS

KR 10-2004-0043048 A 5/2004
KR 10-1404986 B1 6/2014
KR 10-1989366 B1 6/2019

OTHER PUBLICATIONS

Office Action in Korean Appln. No. 10-2020-0141325, mailed on Nov. 4, 2024, 16 pages (with English translation).

*Primary Examiner* — Karla A Moore
(74) *Attorney, Agent, or Firm* — Fish & Richardson P.C.

(57) ABSTRACT

An apparatus for manufacturing a semiconductor device includes first and second process chambers in a first row in a first direction, third and fourth process chambers in a second row in the first direction, the third and fourth process chambers being spaced apart from the first and second process chambers in a second direction, and the first and third process chambers being arranged in parallel in the second direction to perform a same process, a load-lock chamber at one side of the first to fourth process chambers in the first direction, and first and second transfer chambers directly connected to each other in a third row in the first direction, the third row being between the first and second rows, and each of the first and second transfer chambers including a transfer unit to transfer a semiconductor substrate between the first to fourth process chambers and the load-lock chamber.

11 Claims, 17 Drawing Sheets

(51) Int. Cl.
    *C23C 16/40*     (2006.01)
    *C23C 16/54*     (2006.01)
    *H01L 21/67*     (2006.01)
    *H10N 50/01*     (2023.01)

(52) U.S. Cl.
    CPC ........ *C23C 16/54* (2013.01); *H01L 21/67184* (2013.01); *H10N 50/01* (2023.02)

(56) References Cited

U.S. PATENT DOCUMENTS

| | | | |
|---|---|---|---|
| 6,440,261 B1* | 8/2002 | Tepman | H01L 21/67167 204/298.25 |
| 6,977,014 B1* | 12/2005 | Stevens | H01L 21/67017 414/941 |
| 7,407,358 B2 | 8/2008 | Takahashi | |
| 8,758,513 B2 | 6/2014 | Lee et al. | |
| 10,043,693 B1 | 8/2018 | Kim et al. | |
| 2003/0131458 A1* | 7/2003 | Wang | H01L 21/67745 29/25.01 |
| 2004/0101702 A1 | 5/2004 | Kim et al. | |
| 2005/0006230 A1* | 1/2005 | Narushima | H01L 21/67167 118/728 |
| 2007/0144889 A1 | 6/2007 | Koparal et al. | |
| 2010/0239394 A1* | 9/2010 | Watanabe | H01L 21/67745 414/217 |
| 2012/0213938 A1 | 8/2012 | Koparal | |
| 2014/0353149 A1* | 12/2014 | Seino | H01L 21/67173 204/298.25 |
| 2015/0235815 A1* | 8/2015 | Gomi | H01J 37/32733 204/298.27 |
| 2017/0159170 A1* | 6/2017 | Suzuki | H01L 21/681 |
| 2019/0123262 A1 | 4/2019 | Lee et al. | |
| 2020/0006100 A1* | 1/2020 | Clark | H01L 21/67248 |

\* cited by examiner

APPARATUS FOR MANUFACTURING SEMICONDUCTOR DEVICE

CROSS-REFERENCE TO RELATED APPLICATION

Korean Patent Application No. 10-2020-0141325, filed on Oct. 28, 2020, in the Korean Intellectual Property Office, and entitled: "Apparatus for Manufacturing Semiconductor Device," is incorporated by reference herein in its entirety.

BACKGROUND

1. Field

The present disclosure relates to an apparatus for manufacturing a semiconductor device.

2. Description of the Related Art

In a process of manufacturing a semiconductor device, an operation of stacking a plurality of thin films is often required. For example, a wafer may pass through multiple chambers, while a different film may be stacked on the wafer in each of the multiple chambers.

SUMMARY

According to an example embodiment, an apparatus for manufacturing a semiconductor device includes a first process chamber and a second process chamber arranged in a first row in a first direction; a third process chamber and a fourth process chamber, respectively spaced apart from the first and second process chambers in a second direction, intersecting the first direction, and arranged in a second row in the first direction; a load-lock chamber disposed on one side of the first to fourth process chambers in the first direction and receiving a semiconductor substrate transferred to the first to fourth process chamber or transferred from the first to fourth process chambers; and a first transfer chamber and a second process chamber arranged in a third row between the first row and the second row in the first direction, respectively including a transfer unit transferring a semiconductor substrate between the first to fourth process chambers and between the first to fourth process chambers and the load-lock chamber, and arranged to directly transfer a semiconductor substrate to each other. The first and third process chambers, disposed in parallel in the second direction, are chambers in which the same process is performed.

According to an example embodiment, an apparatus for manufacturing a semiconductor device includes a first group of process chambers arranged in a first row in a first direction; a second group of process chambers spaced apart from the first group of process chambers in a second direction, intersecting the first direction, and arranged in a second row in the first direction; a load-lock chamber disposed on one side of the first and second groups of process chambers in the first direction and receiving a semiconductor substrate transferred from the first and second groups of process chambers or transferred to the first and second groups of process chambers; and transfer chambers arranged in a third row between the first row and the second row in the first direction, and respectively including a transfer unit transferring a semiconductor substrate between the first and second groups of process chambers and between the first and second groups of process chambers and the load-lock chamber. A path, along which a semiconductor substrate travels from the load-lock chamber to an end portion in the first direction, is different from a path along which the semiconductor substrate returns to the load-lock chamber from the end portion in the first direction.

According to an example embodiment, an apparatus for manufacturing a semiconductor device includes process chambers arranged in a first row and a second row in a first direction; a load-lock chamber disposed on one side of the process chambers in the first direction and receiving a semiconductor substrate transferred to the process chambers or transferred from the process chambers; and transfer chambers arranged between the process chambers in the first direction, and respectively including a transfer unit transferring a semiconductor substrate between the process chambers and between the process chambers and the load-lock chamber. A semiconductor substrate carried in the load-lock chamber is subjected to a process while being transferred to a process path alternately passing through the process chambers and the transfer chambers, and is transferred to a return path, passing through at least portions of the transfer chambers, without passing through the process chambers, to be taken out to the load-lock chamber.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
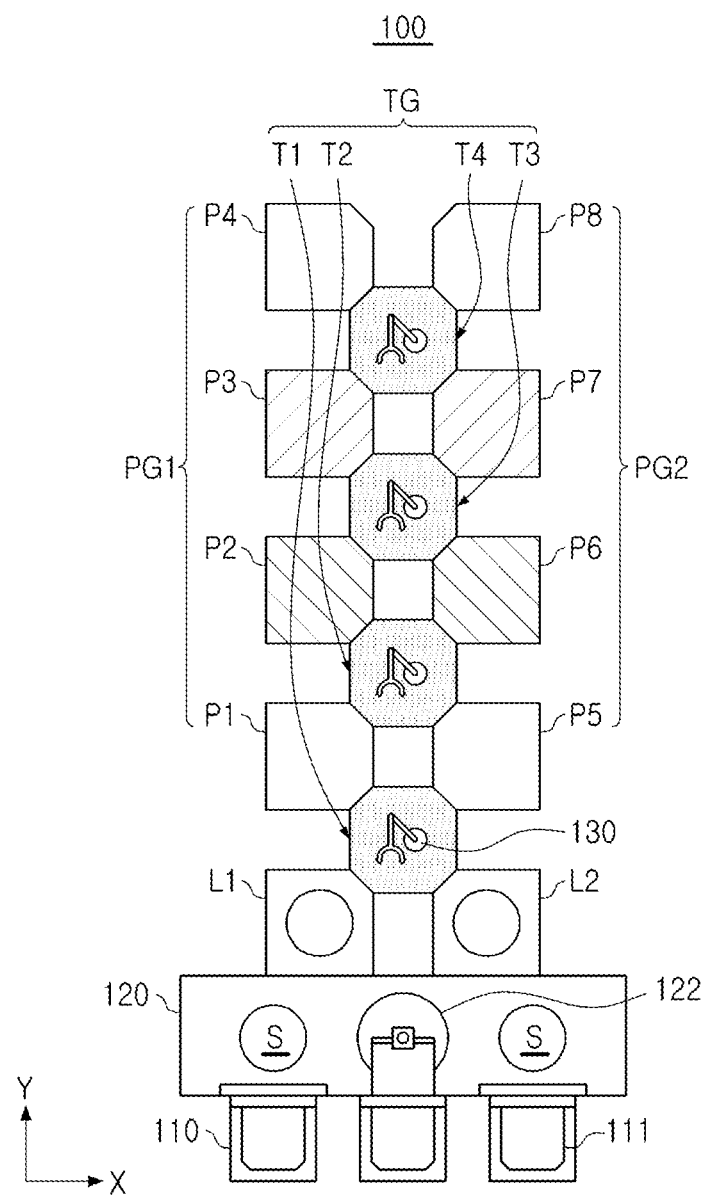
FIG. 1 is a schematic layout diagram of an apparatus for manufacturing a semiconductor device according to example embodiments.

FIG. 1 is a schematic layout diagram of an apparatus for manufacturing a semiconductor device according to example embodiments.

Referring to FIG. 1, an apparatus 100 for manufacturing a semiconductor device (hereinafter referred to as a "manufacturing apparatus 100") may include a first group of process chambers PG1 arranged in a first row in one direction, e.g., along the Y direction, and a second group of process chambers PG2 spaced apart from the first group of process chambers PG1, e.g., along the X direction, to be arranged in a second row in the one direction. Further, the manufacturing apparatus 100 may include load-lock chambers L1 and L2, respectively disposed on one side of the first group of process chambers PG1 and one side of the second group of process chambers PG2, and transfer chamber TG arranged in a third row in the one direction between the first row and the second row and respectively including a transfer unit 130 transferring a semiconductor substrate S. The manufacturing apparatus 100 may further include a load port 110 and a substrate transfer module 120.

The manufacturing apparatus 100 may be an apparatus for forming a thin film on the semiconductor substrate S. The first group of process chambers PG1 and the second group of process chambers PG2 may include a deposition chamber, e.g., at least one of a chemical vapor deposition (CVD) chamber, a physical vapor deposition (PVD) chamber, and an atomic layer deposition (ALD) chamber. According to embodiments, the first and second groups of process chambers PG1 and PG2 may further include at least one of an oxidation chamber, a heat treatment chamber, a cleaning chamber, and an etching chamber.

The load port 110 may be disposed in front of the manufacturing apparatus 100 in the Y direction, and the semiconductor substrate S used in a semiconductor manufacturing process may be placed on the load port 110. In detail, a carrier 111, in which a semiconductor substrate S to be provided for a process and a processed semiconductor substrate S are accommodated, may be seated on the load port 10. The load port 110 may include a plurality of load ports 110, which may be arranged in, e.g., the X direction.

The substrate transfer module 120 may be disposed between the load port 110 and the load-lock chambers L1 and L2. The substrate transfer module 120 may include a transfer robot 122, e.g., a robotic arm. The transfer robot 122 may transfer the semiconductor substrate S between the load port 110 and the load-lock chambers L1 and L2.

The first group of process chambers PG1 may include, e.g., first to fourth process chambers P1, P2, P3, and P4 arranged in the first row in the Y direction. The first to fourth process chambers P1, P2, P3, and P4 may be, e.g., chambers for forming different types of thin films.

The second group of process chambers PG2 may include, e.g., fifth to eighth process chambers P5, P6, P7, and P8 arranged in the second row in the Y direction. The second group of process chambers PG2 may be disposed to be spaced apart from the first group of process chambers PG1 in the X direction. The second group of process chambers PG2 are not necessarily spaced apart from the first group of process chambers PG1 in a direction perpendicular to the first row. For example, each of the second group of process chambers PG2 may be shifted from each of the first group of process chambers PG1, so that the first group of process chambers PG1 and the second group of process chambers PG2 may be arranged in a zigzag pattern. The fifth to eighth process chambers P5, P6, P7, and P8 may be, e.g., chambers for depositing different types of thin films.

In the first and second groups of process chambers PG1 and PG2, a portion of process chambers arranged adjacent to each other in parallel in the X direction may be chambers for performing the same process under the same condition, e.g., chambers for forming the same type of thin film. For example, process chambers that are parallel to each other, e.g., connected in parallel, may be operable simultaneously to perform a same process on different wafers. For example, the second process chamber P2 and the sixth process chamber P6 may be chambers for performing the same process, and the third process chamber P3 and the seventh process chamber P7 may be chambers for performing the same process. In this case, the second process chamber P2, the third process chamber P3, the sixth process chamber P6, and the seventh process chamber P7 may be chambers for performing a process with a relatively long process time, as compared with the other process chambers P1, P4, P5, and P8.

In the present embodiment, the chambers P2/P6 and P3/P7, subjected to an overall process bottleneck caused by a long process time, may be configured in parallel on a process path to reduce an actual process time. In addition, the process chambers P2/P6 and P3/P7 may be disposed adjacent to each other along the X direction, so that time required for transfer to the chambers P2/P6 and P3/P7 and time required for transfer from the chambers P2/P6 and P3/P7 may not be added, e.g., the time may be minimized compared to a serial process.

In example embodiments, the number of the first group of process chambers PG1 and the number of the second group of process chambers PG2 may vary within the range including at least a pair of chambers, disposed in parallel, for performing the same process. For example, according to embodiments, the first group of process chambers PG1 may include only the first process chamber P1 and the second process chamber P2, and the second group of process chambers PG2 may include only the fifth process chamber P5 and the sixth process chamber P6. Alternatively, the first group of process chambers PG1 may include only the third process chamber P3 and the fourth process chamber P4, and the second group of process chambers PG2 may include only the seventh process chamber P7 and the eighth process chamber P8. In yet another alternative, the first and second groups of process chambers PG1 and PG2 may further include chambers configured in parallel and/or chambers configured in series.

The load-lock chambers L1 and L2 may be disposed between the substrate transfer module 120 and the first and second groups of process chambers PG1 and PG2, respectively, on one side of the first and second groups of process chambers PG and PG2. The load-lock chambers L1 and L2 may receive the semiconductor substrate S, e.g., transferred from the substrate transfer module 120 to the first and second groups of process chambers PG1 and PG2 through a first transfer chamber T1 or transferred from the first and second groups of process chambers PG1 and PG2 through the first transfer chamber T1, and may transfer the received semiconductor substrate S to the substrate transfer module 120.

The load-lock chambers L1 and L2 may be maintained in the same vacuum state as the first transfer chamber T1 when the semiconductor substrate S is transferred to or from the first transfer chamber T1. The load-lock chambers L1 and L2 may be maintained at a pressure similar to a pressure of the substrate transfer module 120, e.g., an atmospheric pressure, when the semiconductor substrate S is transferred to or from the substrate transfer module 120. The load-lock chambers L1 and L2 may serve as a cooling chamber and may cool the semiconductor substrate S.

The load-lock chambers L1 and L2 may include a carrying-in load-lock chamber L1 and a taking-out load-lock chamber L2. However, according to embodiments, the number of load-lock chambers L1 and L2 may vary and, e.g., the load-lock chambers L1 and L2 may include only one load-lock chamber.

The transfer chambers TG may transfer a semiconductor substrate S between the first and second groups of process chambers PG1 and PG2, and between the first and second groups of process chambers PG1 and PG2 and the load-lock chambers L1 and L2. The transfer chambers TG may be configured and arranged to directly transfer the semiconductor substrate S to each other. Each of the transfer chambers TG may include a transfer unit 130 for transferring the semiconductor substrate S. The transfer unit 130 may include a transfer robot or a transfer arm, and may be rotatably disposed together with a rotation shaft. In example embodiments, entrance gates may be disposed between the transfer chambers TG and the first and second groups of process chambers PG1 and PG2, and between the transfer chambers TG and the load-lock chambers L1 and L2. When the entrance gate is opened, the transfer unit 130 may carry in or take out the semiconductor substrate S.

The transfer chambers TG may include, e.g., first to fourth transfer chambers T1, T2, T3, and T4 arranged in the third row in the Y direction. For example, the first to fourth transfer chambers T1, T2, T3, and T4 may be directly and sequentially connected to each other along the Y direction. The first transfer chamber T1 may be disposed between the load-lock chambers L1 and L2 and the first and fifth transfer chambers P1 and P5, and the second transfer chamber T2 may be disposed between the fifth transfer chambers P1 and P5 and the second and sixth transfer chambers P2 and P6. The third transfer chamber T3 may be disposed between the second and sixth transfer chambers P2 and P6 and the third and seventh transfer chambers P3 and P7, and the fourth transfer chamber T4 may be disposed between the third and seventh transfer chambers P3 and P7 and the fourth and eighth transfer chambers P4 and P8.

Since FIG. 1 is a schematic diagram illustrating the arrangement of chambers, a specific shape, arrangement, and the like, of each chamber may be changed in various manners. For example, a separation distance between the first and second groups of process chambers PG1 and PG2, lengths at which the transfer chambers TG overlap the first and second groups of process chambers PG1 and PG2 and the load-lock chambers L1 and L2 in the X direction, and the number and sizes of chambers may be changed in various manners in example embodiments.

Figure 2A:
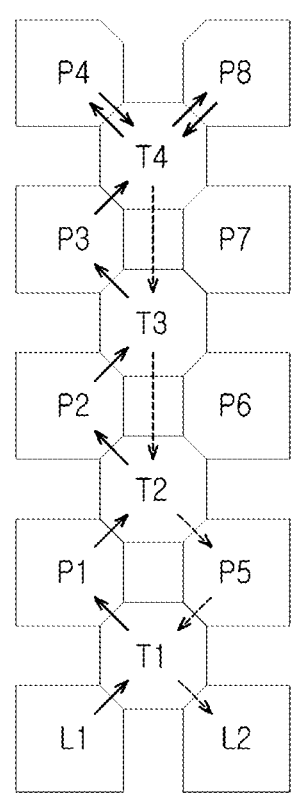
FIGS. 2A and 2B are views illustrating a path of travel of a semiconductor substrate in an apparatus for manufacturing a semiconductor device according to example embodiments.
Figure 2B:
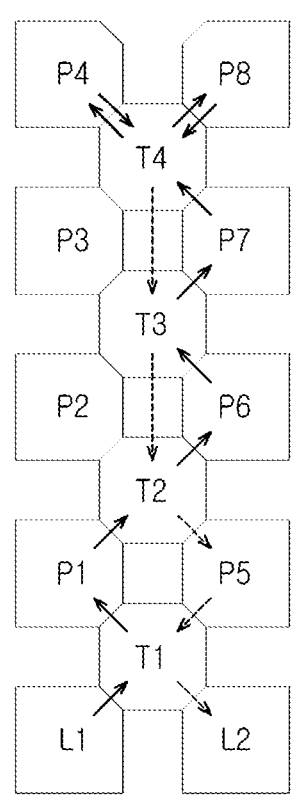

FIGS. 2A and 2B are views illustrating a path of travel of a semiconductor substrate S in the manufacturing apparatus 100 of FIG. 1.

FIGS. 2A and 2B illustrate a first path and a second path while the semiconductor substrate S is carried in and taken out of the manufacturing apparatus 100 of FIG. 1, respectively. Each of the first and second paths may include a process path, indicated by solid arrows, and a return path indicated by dashed arrows. The process path may be a path along which the semiconductor substrate S travels from the first load-lock chamber L1 to the other, e.g., opposite, end of the manufacturing apparatus 100, and the return path may be a path along which the semiconductor substrate S travels from the other end to the second load-lock chamber L2.

For example, the process path may be a sequence of chambers preset, e.g., via a controller, and performed by movement of the transfer robot 122 to perform a predetermined sequence of processes on a semiconductor substrate, e.g., deposit a predetermined sequence of films on a semiconductor substrate. Similarly, the return path may be a sequence of chambers preset to return the semiconductor substrate to an outlet, e.g., to remove the processed semiconductor substrate from the apparatus.

As illustrated in FIG. 2A, the process path of the first path may be a path along which the semiconductor substrate S is transferred in the order of the first load-lock chamber L1, the first transfer chamber T1, the first process chamber P1, the second transfer chamber T2, the second process chamber P2, the third transfer chamber T3, the third process chamber P3, the fourth transfer chamber T4, the fourth process chamber P4, the fourth transfer chamber T4, the eighth process chamber P8, and the fourth transfer chamber T4. The return path of the first path may be a path along which the semiconductor substrate S is transferred in the order of the fourth transfer chamber T4, the third transfer chamber T3, the second transfer chamber T2, the fifth process chamber P5, the first transfer chamber T1, and the second load-lock chamber L2. Therefore, the process path and the return path may be different from each other, e.g., the process path and the return path may include different process chambers that do not overlap.

In detail, according to the first path, processes may be sequentially performed on the semiconductor substrate S in the first to fourth process chambers P1, P2, P3, and P4, and a process may be performed thereon in the eighth process chamber P8, and then a final process may be performed thereon in the fifth process chamber P5 while returning. After the final process is performed, the semiconductor substrate S may be taken out. The semiconductor substrate S may directly travel between at least portions of transfer chambers, e.g., the second, third, and fourth transfer chambers T2, T3, and T4 to return on the return path, after being transferred to the other end of the manufacturing apparatus 100.

As illustrated in FIG. 2B, the process path of the second path may be a path along which a semiconductor substrate S is transferred in the order of the first load-lock chamber L1, the first transfer chamber T1, the first process chamber P1, the second transfer chamber T2, the sixth process chamber P6, the third transfer chamber T3, the seventh process chamber P7, the fourth transfer chamber T4, the fourth process chamber P4, the fourth transfer chamber T4, the eighth process chamber P8, and the fourth transfer chamber T4. The return path of the second path may be a path along which the semiconductor substrate S is transferred in the order of the fourth transfer chamber T4, the third transfer chamber T3, the second transfer chamber T2, the fifth process chamber P5, the first transfer chamber T1, and the second load-lock chamber L2.

In detail, according to the second path, processes may be sequentially performed on the semiconductor substrate S in the first process chamber P1, the sixth process chamber P6, the seventh process chamber P7, the fourth process chamber P4, and the eighth process chamber P8, and then a final process may be performed thereon in the fifth process chamber P5 while returning. After the final process is performed, the semiconductor substrate S may be taken out. In the case of the return path, the return paths in the first path and the second path may be the same, e.g., the transfer chambers TG may be shared by the first and second paths for the return path.

Processes, performed on semiconductor substrates S, may be dividedly performed along the first path and along the second path, e.g., some of the processes may be performed along the first path while other processes may be simultaneously performed along the second path to reduce processing time. Accordingly, processes with a relatively long process time may be dividedly performed in the second process chamber P2 and the sixth process chamber P6, and then dividedly performed in the third process chamber P3 and the seventh process chamber P7. For example, a first portion of processes with a relatively long process time may be sequentially performed in the second and third process chambers P2 and P3 along the first path, while a second portion of processes (different from the first portion) may be sequentially performed in the sixth and seventh process chambers P6 and P7 along the second path, e.g., simultaneously with the first portion of processes. For example, since the second and sixth process chambers P2 and P6 operate in parallel, e.g., simultaneously, and the third and seventh process chambers P3 and P7 operate in parallel, e.g., simultaneously, processing simultaneously lengthy processes via different process paths, e.g., as opposed to only along a single serially arranged process path, may increase output relative to a same processing time. Therefore, unit per equipment hour (UPEH) that is output of an equipment per hour may be increased.

In addition, the return path may be provided as a separate path without overlapping the process paths. This means that a path of travel between two chambers does not have the same portion on the process path and the return path. Accordingly, the number and locations of the process chambers P2/P6 and P3/P7, arranged in parallel, may not be limited to an end portion of the manufacturing apparatus 100. Further, the semiconductor substrate S may not be stuck, e.g., more than one semiconductor substrate S may be moved simultaneously along the different paths (which do not overlap) of a same apparatus, so that the efficiency of the manufacturing apparatus 100 may be improved.

In an example embodiment, when the first group of process chambers PG1 of FIG. 1 includes only the third process chamber P3 and the fourth process chamber P4, the second group of process chambers PG2 of FIG. 1 includes only the seventh process chamber P7 and the eighth process chamber P8, and the transfer chambers TG include only the third transfer chamber T3 and the fourth transfer chamber T4, the first path and the second path may be as follows.

The first path may include a path along which a semiconductor substrate S travels in the order of the first load-lock chamber L1, the third transfer chamber T3, the third process chamber P3, the fourth transfer chamber T4, the fourth process chamber P4, the fourth transfer chamber T4, the eighth process chamber P8, the fourth transfer chamber T4, the third transfer chamber T3, and the second load-lock chamber L2. The second path may include a path along which a semiconductor substrate S travels in the order of the first load-lock chamber L1, the third transfer chamber T3, the seventh process chamber P7, the fourth transfer chamber T4, the fourth process chamber P4, the fourth transfer chamber T4, the eighth process chamber P8, the fourth transfer chamber T4, the third transfer chamber T3, and the second load-lock chamber L2. As described above, even when a portion of chambers are omitted or added in the manufacturing apparatus 100, a path may be determined in the same manner.

Figure 3:
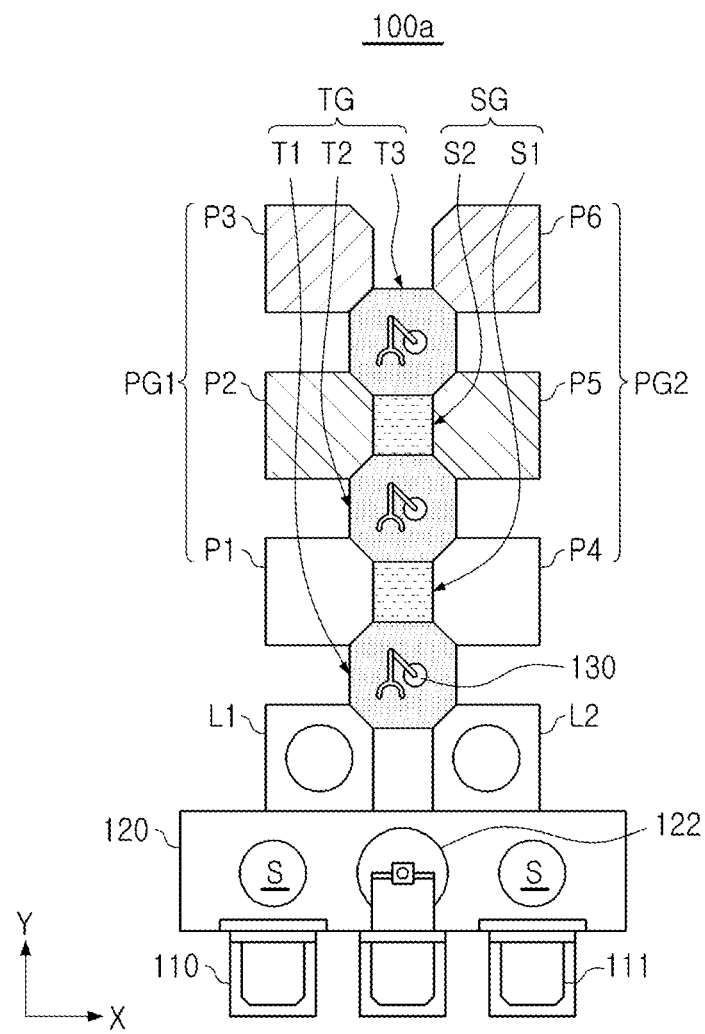
FIG. 3 is a schematic layout diagram of an apparatus for manufacturing a semiconductor device according to example embodiments.

FIG. 3 is a schematic layout diagram of an apparatus for manufacturing a semiconductor device according to example embodiments.

Referring to FIG. 3, unlike the embodiment of FIG. 1, an apparatus 100a for manufacturing a semiconductor device (hereinafter referred to as a "manufacturing apparatus 100a") may further include supplement chambers SG arranged in a third row together with the transfer chambers TG. In addition, the first group of process chambers PG1 and the second group of process chambers PG2 may include first to third process chambers P1, P2, and P3 and fourth to sixth process chambers P4, P5, and P6, respectively. Hereinafter, the same or substantially the same descriptions as provided with reference to FIG. 1 will be omitted.

The supplement chambers SG may be disposed between adjacent transfer chambers TG, e.g., the supplement chambers SG and the transfer chambers TG may be arranged alternately along the Y direction. The supplement chambers SG may include a first supplement chamber S1, disposed between a first transfer chamber T1 and a second transfer chamber T2, and a second supplement chamber S2 disposed between a second transfer chamber T2 and a third transfer chamber T3. Similarly to the first and second groups of process chambers PG1 and PG2, the supplement chambers SG may be chambers for performing processes.

In the first and second groups of process chambers PG1 and PG2, the second process chamber P2 and the fifth process chamber P5 may be chambers for performing the same process, and the third process chamber P3 and the sixth process chamber P6 may be chambers for performing the same process. In this case, the second process chamber P2, the third process chamber P3, the fifth process chamber P5, and the sixth process chamber P6 may be chambers with a relatively long process time, as compared with the other process chambers P1 and P4.

As compared with the manufacturing apparatus 100 of the embodiment described with reference to FIG. 1, the manufacturing apparatus 100a may include two supplement chambers SG while including two fewer process chambers. Thus, the manufacturing apparatus 100a may significantly decrease in area while performing, e.g., the same processes as the manufacturing apparatus 100 of the embodiment described with reference to FIG. 1.

Figure 4A:
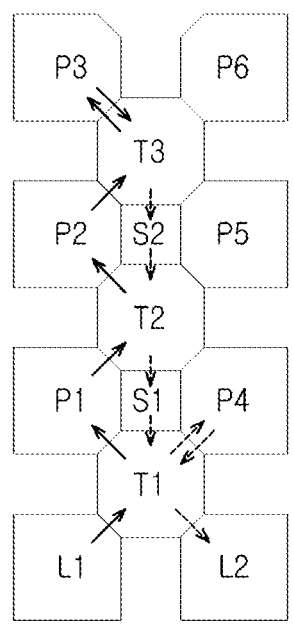
FIGS. 4A and 4B are views illustrating a path of travel of a semiconductor substrate in an apparatus for manufacturing a semiconductor device according to example embodiments.
Figure 4B:
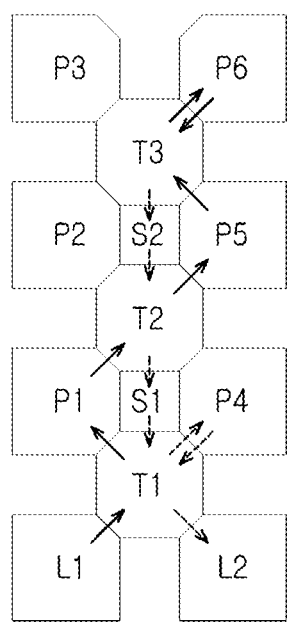

FIGS. 4A and 4B are views illustrating a path of travel of a semiconductor substrate in the manufacturing apparatus 100a according to example embodiments.

FIGS. 4A and 4B illustrate a first path and a second path while a semiconductor substrate S is carried in and taken out of the manufacturing apparatus 100a of FIG. 3, respectively. Each of the first and second paths may include a process path, indicated by solid arrows, and a return path indicated by dashed arrows.

As illustrated in FIG. 4A, the process path of the first path may be a path along which a semiconductor substrate S is transferred in the order of the first load-lock chamber L1, the first transfer chamber T1, the first process chamber P1, the second transfer chamber T2, the second process chamber P2, the third transfer chamber T3, the third process chamber P3, and the third transfer chamber T3. The return path of the first path may be a path along which the semiconductor substrate S is transferred in the order of the third transfer chamber T3, the second supplementary chamber S2, the second transfer chamber T2, the first supplement chamber S1, the first transfer chamber T1, the fourth process chamber P4, the first transfer chamber T1, and the second load-lock chamber L2.

According to the first path, processes may be sequentially performed on the semiconductor substrate S in the first to third process chamber P1, P2, and P3, and then a process may be performed thereon in the second supplement chamber S2 and the first supplement chamber S1 while returning. A final process may be performed on the semiconductor substrate S in the fourth process chamber P4, and then the semiconductor substrate S may be taken out. The semiconductor substrate S may be transferred by alternately passing through the transfer chambers T1, T2, and T3 and the supplement chambers S1 and S2 on a return path after being transferred to the other end of the manufacturing apparatus 100a. The return path may include a path along which the semiconductor substrate S is transferred between the transfer chambers T1, T2, and T3 without passing through the process chambers P1, P2, P3, P5, and P6.

As illustrated in FIG. 4B, the process path of the second path may be a path along which a semiconductor substrate S is transferred in the order of the first load-lock chamber L1, the first transfer chamber T1, the first process chamber P1, the second transfer chamber T2, the fifth process chamber P5, the third transfer chamber T3, the sixth process chamber P6, and the third transfer chamber T3. The return path of the second path may be a path along which the semiconductor substrate S is transferred in the order of the third transfer chamber T3, the second supplement chamber S2, the second transfer chamber T2, the first supplement chamber S1, the first transfer chamber T1, the fourth process chamber P4, the first transfer chamber T1, and the second load-lock chamber L2.

According to the second path, processes may be sequentially performed on the semiconductor substrate S in the first process chamber P1, the fifth process chamber P5, and the sixth process chamber P6, and then a process may be performed thereon in the second supplement chamber S2 and the first supplement chamber S1 while returning. A final process may be performed on the semiconductor substrate S in the fourth process chamber P4, and then the semiconductor substrate S may be taken out. In the case of the return path, the first path and the second path may be the same.

Processes, performed on the semiconductor substrates S, may be dividedly performed along the first path and the second path. Accordingly, processes with a relatively long process time may be dividedly, e.g., and simultaneously, performed in the second process chamber P2 and the fifth chamber P5, and then dividedly, e.g., and simultaneously, performed in the third process chamber P3 and the sixth process chamber P6. Therefore, unit per equipment hour (UPEH) may be increased. In addition, the return path may be provided as a separate path without overlapping the process paths. This means that a path of travel between two chambers does not have the same portion on the process path and the return path. Accordingly, the number and locations of the process chambers P2/P5 and P3/P6, arranged in parallel, may not be limited to an end portion of the manufacturing apparatus 100a, and the efficiency of the manufacturing apparatus 100a may be more secured. In addition, since a portion of processes are performed in the supplement chambers S1 and S2, an area of the manufacturing apparatus 100a may be significantly reduced.

In an example embodiment, when the first group of process chambers PG1 of FIG. 3 includes only the first process chamber P1 and second process chamber P2, the second group of process chambers PG2 of FIG. 3 includes only the fourth process chamber P4 and the fifth process chamber P5, the transfer chambers TG include only the first transfer chamber T1 and the second transfer chamber T2, and the supplement chambers SG include only the first supplement chamber S1, the first path and the second path may be as follows.

The first path may include a path along which a semiconductor substrate S travels in the order of the first load-lock chamber L1, the first transfer chamber T1, the first process chamber P1, the second transfer chamber T2, the second process chamber P2, the second transfer chamber T2, the first supplement chamber S1, the first transfer chamber T1, the fourth process chamber P4, the first transfer chamber T1, and the second load-lock chamber L2. The second path includes a path along which the semiconductor substrate S travels in the order of the first load-lock chamber L1, the first transfer chamber T1, the first process chamber P1, the second transfer chamber T2, the fifth process chamber P5, the second transfer chamber T2, the first supplement chamber S1, the first transfer chamber T1, the fourth process chamber P4, the first transfer chamber T1, and the second load-lock chamber L2. As described above, even when a portion of chambers are omitted or added in the manufacturing apparatus 100a, a path may be determined in the same manner.

Tables 1 and 2 illustrate process times and efficiencies of manufacturing apparatuses in a Comparative Example and Embodiments.

In Tables 1 and 2, the Comparative Example illustrates an example of a process time in a comparative manufacturing apparatus configured to perform processes in series while sequentially passing through six process chambers, i.e., process chamber P1 through P6 arranged sequentially in series, arranged in two rows or in a U-shape. The First Embodiment corresponds to a case in which a first group of process chambers P1 through P4, and a second group of process chambers P5 through P8 are arranged in parallel in the manufacturing apparatus 100 described above with reference to FIGS. 1 to 2B, and the Second Example corresponds to a case in which a first group of process chambers P1 through P4, and a second group of process chambers P5 through P8 are arranged in parallel in the manufacturing apparatus 100a described above with reference to FIGS. 3 to 4B. In Tables 1 and 2, a process time refers to a time required to perform a process per a semiconductor substrate or a wafer, e.g., a single process in a single process chamber on a semiconductor substrate or a wafer.

TABLE 1

Process Times in the Comparative Example and Embodiments

| Comparative Example | | First Embodiment | | Second Embodiment | |
| --- | --- | --- | --- | --- | --- |
| Chamber | Process Time [sec] | Chamber | Process Time [sec] | Chamber | Process Time [sec] |
| L1 | 30 | L1 | 30 | L1 | 30 |
| T1 | 15 | T1 | 15 | T1 | 15 |
| P1 | 110 | P1 | 110 | P1 | 110 |
| T2 | 15 | T2 | 15 | T2 | 15 |
| P2 | 240 | P2/P6 | 120 | P2/P5 | 120 |
| T3 | 15 | T3 | 15 | T3 | 15 |
| P3 | 220 | P3/P7 | 110 | P3/P6 | 110 |
| T3 | 15 | T4 | 15 | T3 | 15 |
| P6 | 110 | P4 | 110 | S2 | 110 |
| T3 | 15 | T4 | 15 | T2 | 15 |
| P5 | 90 | P8 | 90 | S1 | 90 |
| T2 | 15 | T4 | 15 | T1 | 15 |
| P4 | 60 | T3 | 15 | P4 | 60 |
| T1 | 15 | T2 | 15 | T1 | 15 |
| L2 | 30 | P5 | 60 | L2 | 30 |
| | | T1 | 15 | | |
| | | L2 | 30 | | |

Referring to Table 1, as indicated above, in the First and Second Embodiments, two processes with the longest process times are dividedly performed in two chambers, respectively. For example, instead of performing the entire process in a single process chamber P2 of the Comparative Embodiment, two process chambers (P2/P6 and P3/P7) in parallel are used in each of the First and Second Embodiments. Therefore, a process time per a semiconductor substrate may decrease by half, as compared with the Comparative Example.

TABLE 2

Efficiency of Manufacturing Apparatus in the Comparative Example and Embodiments

|  | Comparative Example | First Embodiment | Second Embodiment |
|---|---|---|---|
| UPEH | 15 | 30 | 30 |
| Apparatus Area | 10.5 | 13.5 | 10.5 |
| UPEH/Apparatus | 1.43 | 2.22 | 2.86 |

Referring to Table 2, unit per equipment hour (UPEH) may be increased in the First and Second Embodiments, as compared with the Comparative Example. In detail, in the Comparative Example, UPEH is calculated as an hour/240 seconds, resulting in 15 depending on a chamber having the longest processing time. In the First and Second Embodiments, processes are dividedly performed on semiconductor substrates in two chambers, having the longest processing time, provided in parallel, so that UPEH is determined by a greater value of 240 sec/2, the half of the longest process time, and 110 seconds, the longest time of the other chambers. Thus, in the First and Second Embodiments, UPEH is calculated as an hour/120 seconds, resulting in 30. That is, in the First and Second Embodiments, the UPEH may be doubled as compared with that in the Comparative Example.

Areas of manufacturing apparatuses are values under the assumption that each chamber has a horizontal length of 1 m and a vertical length of 0.5 m. In the First Embodiment, since the number of chambers is two more than the number of chambers in the Comparative Example, an area of the manufacturing apparatus is increased. In the Second Embodiment, since supplement chambers are used, the manufacturing apparatus has the same area as the manufacturing apparatus in the Comparative Example. Accordingly, UPEH per area of manufacturing apparatus was 1.43 in the Comparative Example, 2.22 in the First Embodiment, and 2.86 in the Second Embodiment. In other words, UPEH per area of manufacturing apparatus was high in the First and Second Embodiments, i.e., was highest in the Second Embodiment.

Figure 5:
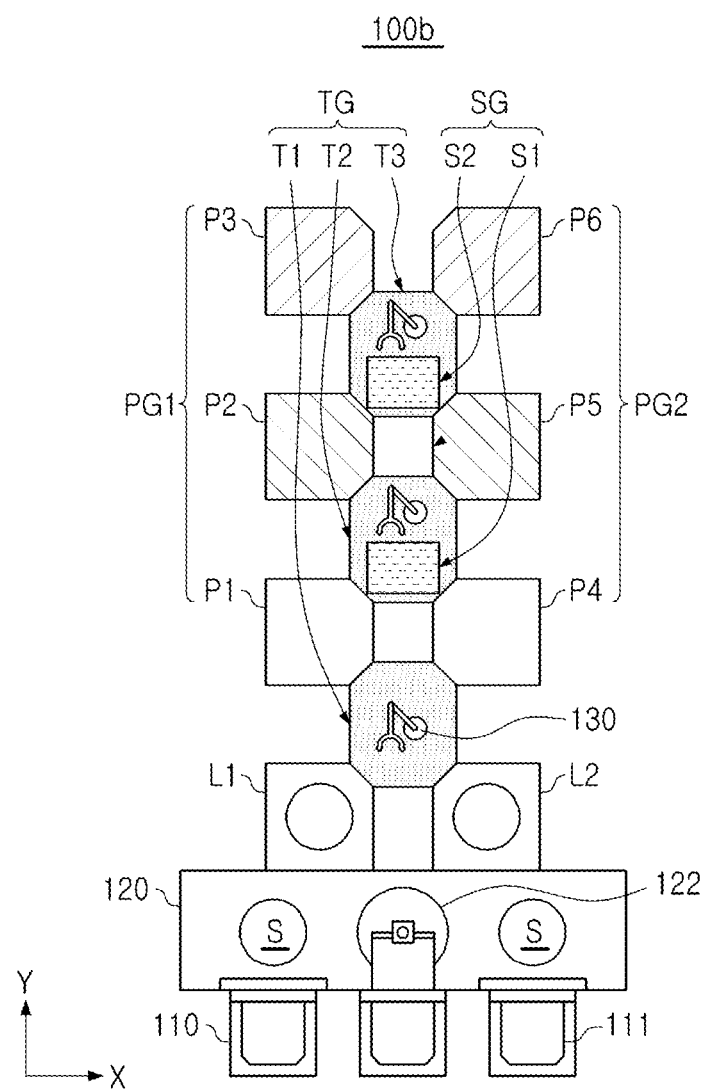
FIG. 5 is a schematic layout diagram of an apparatus for manufacturing a semiconductor device according to example embodiments.

FIG. 5 is a schematic layout diagram of an apparatus for manufacturing a semiconductor device according to example embodiments.

Referring to FIG. 5, unlike the embodiment of FIG. 3, in an apparatus 100*b* for manufacturing a semiconductor device (hereinafter referred to as a "manufacturing apparatus 100*b*"), supplement chambers SG arranged in a third row may be disposed in the transfer chambers TG. Hereinafter, the same or substantially the same descriptions as provided with reference to FIGS. 1 and 3 will be omitted.

The supplement chambers SG may be disposed in portions of adjacent transfer chambers TG, e.g., a second transfer chamber T2 and a third transfer chamber T3. However, the configuration of the transfer chambers TG, in which the supplement chambers SG are disposed, may be changed in various manners in embodiments. In example embodiments, the transfer chambers TG may have a relatively increased size to include the supplement chambers SG. Even in this case, the transfer chambers TG may have an increased size using an empty space between chambers. Accordingly, an overall area of the manufacturing apparatus 100*b* may not be changed or may be increased to be significantly small.

Figure 6:
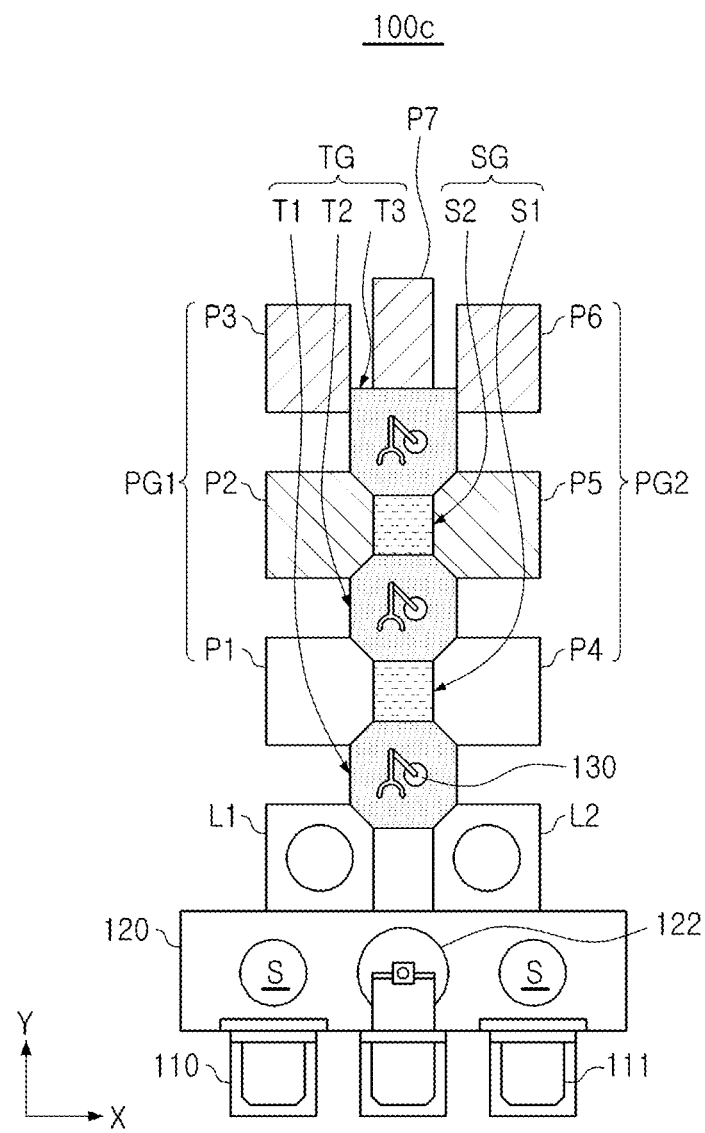
FIG. 6 is a schematic layout diagram of an apparatus for manufacturing a semiconductor device according to example embodiments.

FIG. 6 is a schematic layout diagram of an apparatus for manufacturing a semiconductor device according to example embodiments.

Referring to FIG. 6, unlike the embodiment of FIG. 3, an apparatus 100*c* for manufacturing a semiconductor device (hereinafter referred to as an "manufacturing apparatus 100*c*") may further include a seventh process chamber P7 arranged at an end portion in a third row. Hereinafter, the same or substantially the same descriptions as provided with reference to FIGS. 1 and 3 will be omitted.

The seventh process chamber P7 may be a chamber for performing the same process as the third process chamber P3 and the sixth process chamber P6. Accordingly, a semiconductor substrate S may be processed along a process path passing through one of the third process chamber P3, the sixth process chamber P6, and the seventh process chamber P7, and UPEH of the manufacturing apparatus 100*c* of may be further increased. As described above, in the case in which transfer times before and after a process may not be increased, including the case in which chambers with a relatively long process time are disposed at end potions, the number of the same process chambers provided in parallel is not limited to two and may be changed in various manners.

Figure 7:
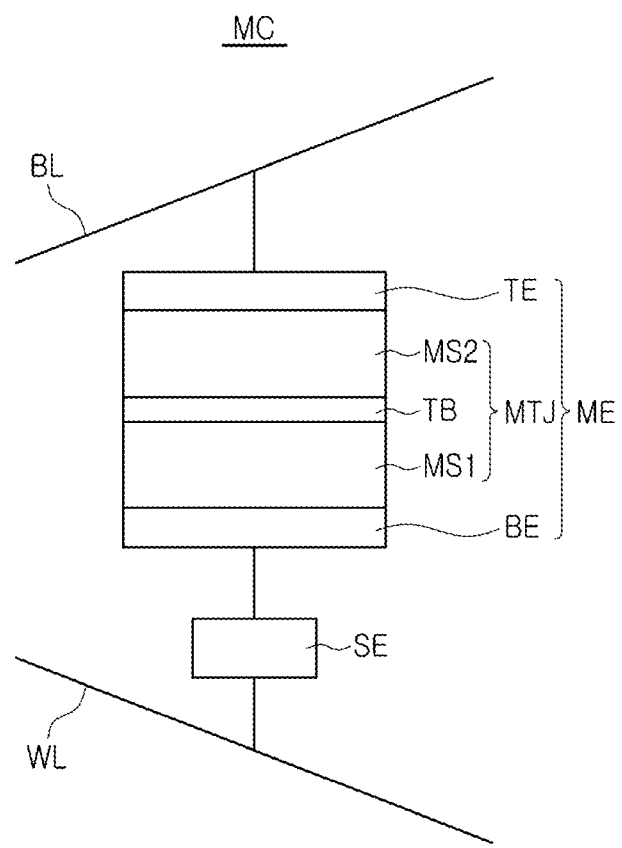
FIG. 7 is a view illustrating a unit memory cell of a semiconductor device according to example embodiments.

FIG. 7 is a view illustrating a unit memory cell of a semiconductor device according to example embodiments.

Referring to FIG. 7, a unit memory cell MC may be a memory cell of a magnetic memory device, and may include a memory element ME and a select element SE. The memory element ME may be connected between a bitline BL and the select element SE, and the select element SE may be connected between the memory element ME and a wordline WL.

The memory element ME may include a magnetic tunnel junction layer MTJ, a bottom electrode BE, and a top electrode TE. The magnetic tunnel junction layer MTJ may be a variable resistance element switchable to two resistance states by an electric pulse applied to the magnetic tunnel junction layer MTJ. The magnetic tunnel junction layer MTJ may include at least one ferromagnetic material and/or at least one antiferromagnetic material. In detail, the magnetic tunnel junction layer MTJ may include a first magnetic layer MS1, a second magnetic layer MS2, and a tunnel barrier layer TB disposed therebetween. Each of the first and second magnetic layers MS1 and MS2 may include at least one magnetic layer formed of a magnetic material. The bottom electrode BE may be interposed between the first magnetic layer MS1 and the selection element SE, and the top electrode TE may be interposed between the second magnetic layer MS2 and the bitline BL.

The select element SE may be configured to selectively control a flow of charges passing through the memory element ME. For example, the select element SE may be one of a diode, a bipolar transistor, and a field effect transistor. When the select element SE includes a three-terminal bipolar transistor or a field effect transistor, an additional interconnection may be connected to the select element SE.

Figure 8A:
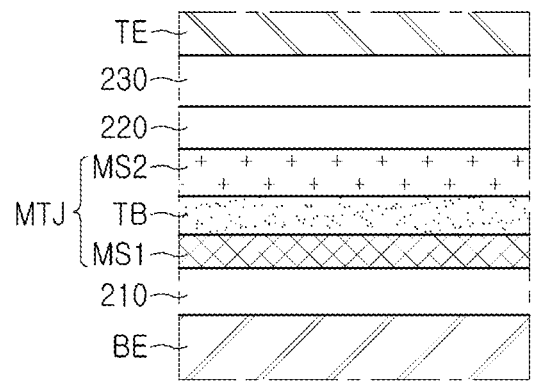
FIGS. 8A and 8B are cross-sectional views illustrating memory elements according to example embodiments, respectively.
Figure 8B:
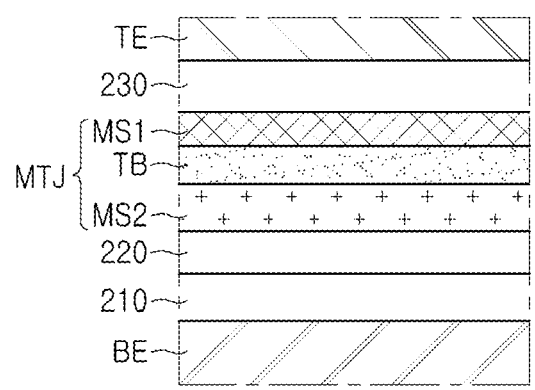

FIGS. 8A and 8B are detailed cross-sectional views illustrating memory elements according to example embodiments, respectively.

Referring to FIG. 8A, the memory element ME may include a seed layer 210, the first magnetic layer MS1, the tunnel barrier layer TB, the second magnetic layer MS2, an oxide layer 220, and a capping layer 230 sequentially stacked between the bottom electrode BE and the top electrode TE. The memory element ME may have a structure in which the second magnetic layer MS2, i.e., a free layer, is disposed above the first magnetic layer MS1.

Each of the bottom electrode BE and the top electrode TE may include a conductive material, e.g., titanium (T1), tantalum (Ta), ruthenium (Ru), titanium nitride (TiN), tantalum nitride (TaN), tungsten (W), or the like.

The seed layer 210 may contribute to growth of the magnetic tunnel junction layer MTJ disposed thereon, and may be a layer for securing crystallinity of the magnetic tunnel junction layer MTJ. The seed layer 210 may include at least one of, e.g., tantalum (Ta), ruthenium (Ru), and alloys thereof.

The magnetic tunnel junction layer MTJ may include the first magnetic layer MS1, the tunnel barrier layer TB, and the second magnetic layer MS2. The first magnetic layer MS1 may be a pinned layer having a pinned magnetization direction, and the second magnetic layer MS2 may be a free layer having a magnetization direction freely changed by an external magnetic field. Each of the first and second magnetic layers MS1 and MS2 may include a magnetic material including a transition metal. Each of the first and second magnetic layers MS1 and MS2 may include at least one of, e.g., palladium (Pd), cobalt (Co), platinum (Pt), iron (Fe), ruthenium (Ru), tantalum (Ta), nickel (Ni), boron (B), manganese (Mn), antimony (Sb), aluminum (Al), chromium (Cr), molybdenum (Mo), silicon (Si), copper (Cu), iridium (Ir), and alloys thereof. The tunnel barrier layer TB may be interposed between the first and second magnetic layers MS1 and MS2, and quantum tunneling may occur in the tunnel barrier layer TB. The tunnel barrier layer TB may include an insulating metal oxide. For example, the tunnel barrier layer TB may include magnesium oxide (MgO), aluminum oxide (AlO), or combinations thereof.

The oxide layer 220 may be a layer for improving magnetic characteristics of the magnetic tunnel junction layer MTJ. For example, the oxide layer 220 may induce the second magnetic layer MS2 to have a perpendicular magnetization direction. The oxide layer 220 may include, e.g., a metal oxide such as a magnesium oxide (MgO). According to embodiments, the oxide layer 220 may be replaced with a metal layer.

The capping layer 230 may be a layer for protecting the magnetic tunnel junction layer MTJ, and may include, e.g., a metal material, a metal oxide, or a magnetic material. For example, the capping layer 230 may include tantalum (Ta) and/or ruthenium (Ru).

Referring to FIG. 8B, the memory element ME may include the seed layer 210, the oxide layer 220, the second magnetic layer MS2, the tunnel barrier layer TB, the first magnetic layer MS1, and the capping layer 230 sequentially stacked between the bottom electrode BE and the top electrode TE. The memory element ME may have a structure in which the second magnetic layer MS2, i.e., a free layer, is disposed below the first magnetic layer MS1. The descriptions provided with reference to FIG. 8A may be equally applied to the other descriptions.

However, in example embodiments, the type and placement of each of the layers, constituting the memory element ME, may be changed in various manners.

Figure 9A:
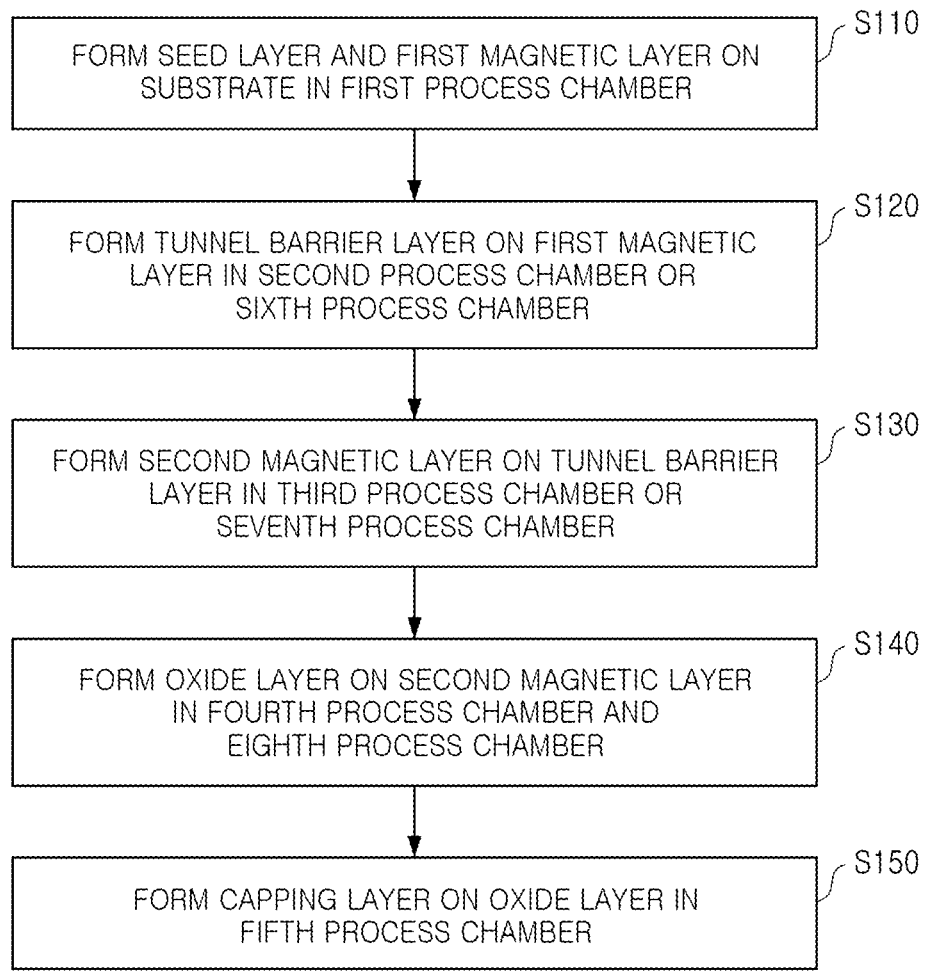
FIGS. 9A and 9B are flowcharts illustrating processes of manufacturing a memory element according to example embodiments, respectively.
Figure 9B:
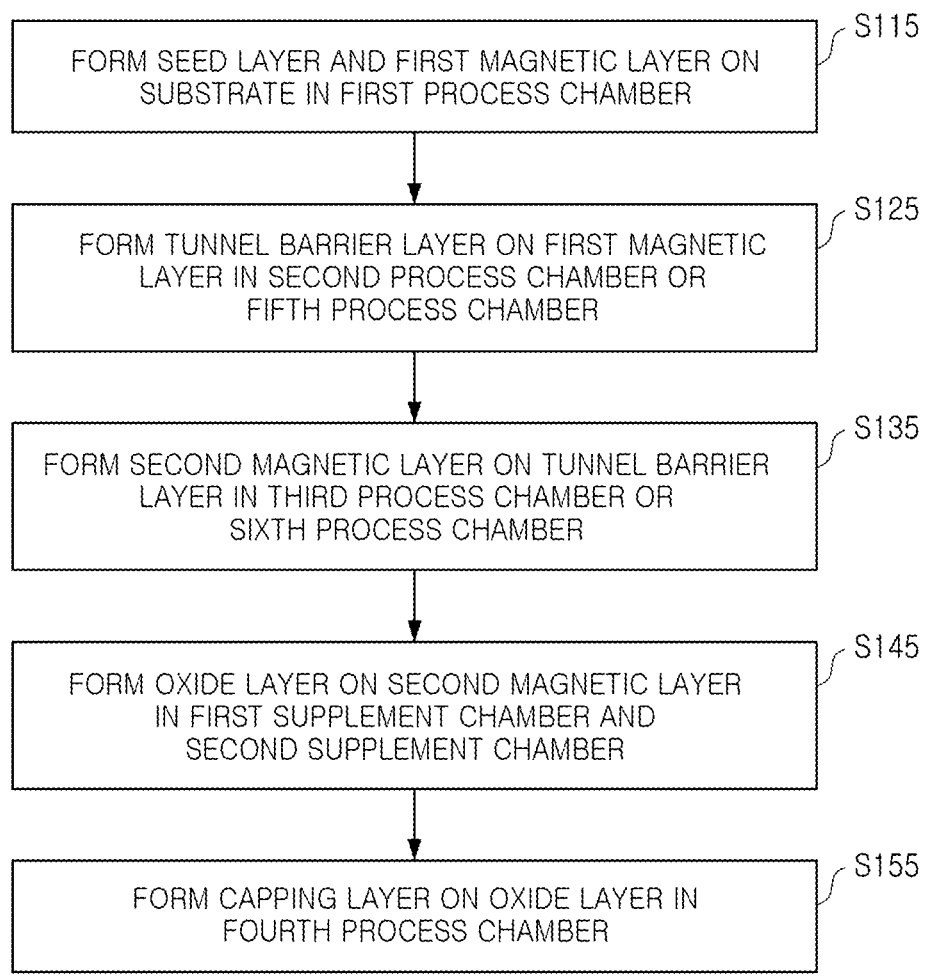

FIGS. 9A and 9B are flowcharts illustrating processes of manufacturing a memory device according to example embodiments, respectively. In FIGS. 9A and 9B, processes of manufacturing the memory element ME of FIG. 8A using the manufacturing apparatuses 100 and 100a of FIGS. 1 and 3 will be described, respectively. The processes will be described with reference to FIGS. 1, 3, and 8A together.

Referring to FIG. 9A, a method of manufacturing the memory element ME may include forming the seed layer 210 and the first magnetic layer MS1 on a substrate in the first process chamber P1 (S110), forming the tunnel barrier layer TB on the first magnetic layer MS1 in the second process chamber P2 or the sixth process chamber P6 (S120), forming the second magnetic layer MS2 on the tunnel barrier layer TB in the third process chamber P3 or the seventh process chamber P7 (S130), forming the oxide layer 220 on the second magnetic layer MS2 in the fourth process chamber P4 and the eighth process chamber P8 (S140), and forming the capping layer 230 on the oxide layer 220 in the fifth process chamber P5 (S150).

For example, a process of forming the tunnel barrier layer TB and a process of forming the second magnetic layer MS2, with relatively long process time, may be dividedly performed in the chambers P2/P6 and P3/P7, disposed in parallel, respectively. Accordingly, productivity, e.g., UPEH, in a process of manufacturing the overall memory element ME may increase. However, in example embodiments, a method of dividing the respective layers constituting the memory element ME for each chamber may be changed in various manners.

Referring to FIG. 9B, a method of manufacturing the memory element ME may include forming the seed layer 210 and the first magnetic layer MS1 on a substrate in the first process chamber P1 (S115), forming the tunnel barrier layer TB on the first magnetic layer MS1 in the second process chamber P2 or the fifth process chamber P5 (S125), forming the second magnetic layer MS2 on the tunnel barrier layer TB in the third process chamber P3 or the sixth process chamber P6 (S135), forming the oxide layer 220 on the second magnetic layer MS2 in the first supplement chamber S1 and the second supplement chamber S2 (S145), and forming the capping layer 230 on the oxide layer 220 in the fourth process chamber P4 (S155).

Even in the present embodiment, a process of forming the tunnel barrier layer TB and a process of forming the second magnetic layer MS2, with relatively long process time, may be dividedly performed in the chambers P2/P5 and P3/P6, disposed in parallel, respectively. Accordingly, productivity, e.g., UPEH, in a process of manufacturing an overall memory element ME may increase.

FIGS. 10A through 10F are cross-sectional views illustrating stages in a process of manufacturing a memory element according to example embodiments. In FIGS. 10A to 10F, a processing of manufacturing a semiconductor device including the memory element ME of FIG. 8A will be described.

Figure 10A:
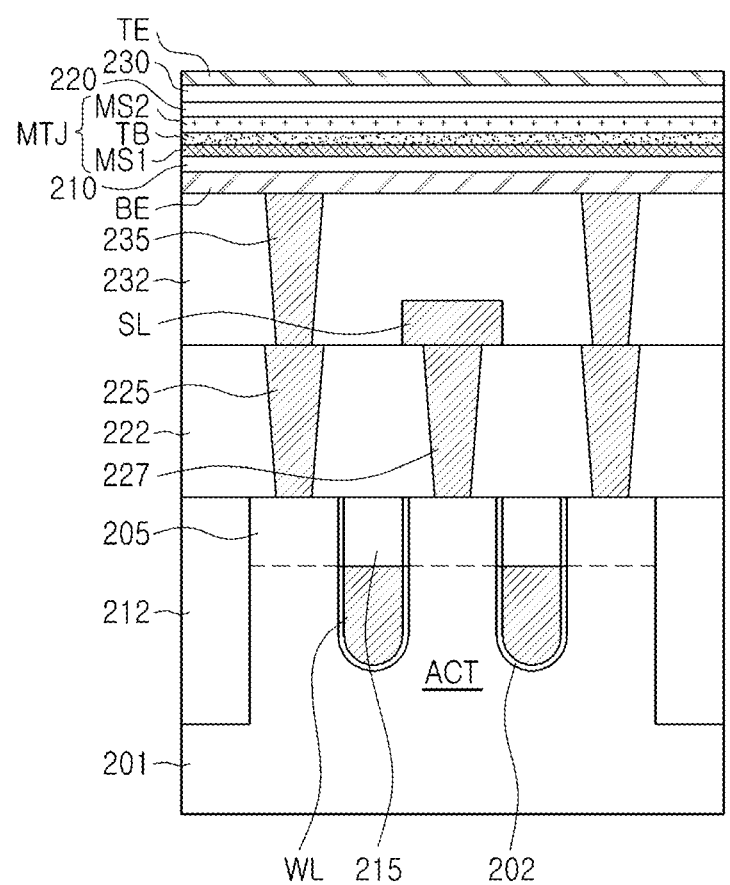
FIGS. 10A through 10F are cross-sectional views of stages in a process of manufacturing a memory element according to example embodiments.

Referring to FIG. 10A, layers constituting the memory element ME may be formed on a substrate structure including a wordline WL and a source line SL. Device isolation layers 212 may be formed in a substrate 201 to define an active region ACT, and the word lines WL may be formed.

The substrate 201 may include a semiconductor material, e.g., a group IV semiconductor, a group III-V compound semiconductor, or a group II-VI oxide semiconductor. For example, the group IV semiconductor may include silicon, germanium, or silicon-germanium. The substrate 201 may be provided as a bulk wafer, an epitaxial layer, a silicon-on-insulator (SOI) layer, or a semiconductor-on-insulator (SeOI) layer.

The device isolation layer 212 may be formed of an insulating material. The device isolation layer 212 may be formed by, e.g., a shallow trench isolation (STI) process. The device isolation layer 212 may include, e.g., an oxide, a nitride, or a combination thereof.

The active region ACT is defined by the device isolation layer 212, and impurity regions 205 acting as a source or drain region are formed in the active region ACT. The impurity regions 205 may extend inwardly of the substrate 201 from an upper surface of the active region ACT to a predetermined depth. The impurity regions 205 may include impurities having a conductivity type different from a conductivity type of impurities of the active region ACT. The impurity regions 205 may serve as, e.g., a source/drain region of a transistor formed by a wordline WL.

Next, wordlines WL may be formed in the active region ACT. The wordlines WL may be disposed to be buried in the substrate 201 in such a manner that two wordlines WL pass for each impurity region 205. The wordline WL may be formed in a trench and may have an upper surface disposed on a lower level than an upper surface of the active region ACT. The wordline WL may include, e.g., a metal, a metal nitride, or doped polysilicon. An upper surface of the wordline WL may be covered with a gate capping layer 215. The gate capping layer 215 may be formed of, e.g., a silicon nitride. A gate insulating layer 202 may be disposed between the wordline WL and the active region ACT. The gate insulating layer 202 may be formed of, e.g., an oxide, a nitride, or an oxynitride. The gate insulating layer 202 may include, e.g., a silicon oxide layer or an insulating layer having a high-k dielectric constant.

In the present embodiment, a description has been provided of the case in which the wordline WL is a buried wordline constituting a buried channel array transistor (BCAT), but the present disclosure is not limited thereto. For example, the wordline WL may be transformed into a transistor structure, e.g., a planar transistor, a recess channel array transistor (RCAT), a sphere-shaped recess channel array transistor (SRCAT), or the like.

Next, a first interlayer insulating layer 222 and first and second contact plugs 225 and 227 may be formed on the substrate 101 on which the active region ACT and the word line WL are formed.

The first interlayer insulating layer 222 may include an insulating material, e.g., a silicon oxide. The first and second contact plugs 225 and 227 may be formed by removing a portion of the first interlayer insulating layer 222 using an exposure process and an etching process to form contact holes, depositing a conductive material to fill the contact holes, and performing a planarization process. Each of the first and second contact plugs 225 and 227 may include at least one of, e.g., doped silicon, tungsten (W), aluminum (Al), titanium (Ti), tantalum (Ta), titanium nitride (TiN), tantalum nitride (TaN), tungsten nitride (WN), and metal silicide.

Next, the source line SL may be formed on the second contact plug 227 on the first interlayer insulating layer 222, and then a second interlayer insulating layer 232 and the third contact plugs 235 may be formed on the first interlayer insulating layer 222. The source line SL may include a conductive material, and may include at least one of, e.g., doped polysilicon, metal silicide, metal, and metal nitride.

The second interlayer insulating layer 232 may be formed of the same or similar material as the first interlayer insulating layer 222. The third contact plugs 235 may be formed by removing a portion of the second interlayer insulating layer 232 to form contact holes, depositing a conductive material to fill the contact holes, and performing a planarization process. The third contact plugs 235 may be formed of the same or similar material as the first and second contact plugs 225 and 227.

Next, layers constituting the memory element ME of FIG. 8A may be sequentially formed from the bottom electrode BE covering the third contact plugs 235 and the second interlayer insulating layer 232. The layers, constituting the memory element ME, may be deposited to be stacked by, e.g., the process operations described above with reference to FIGS. 9A and 9B. In example embodiments, at least a portion of the magnetic tunnel junction layer MTJ may be formed, and then an annealing process may be further performed to align a magnetization direction of the magnetic tunnel junction layer MTJ with one desired direction.

Figure 10B:
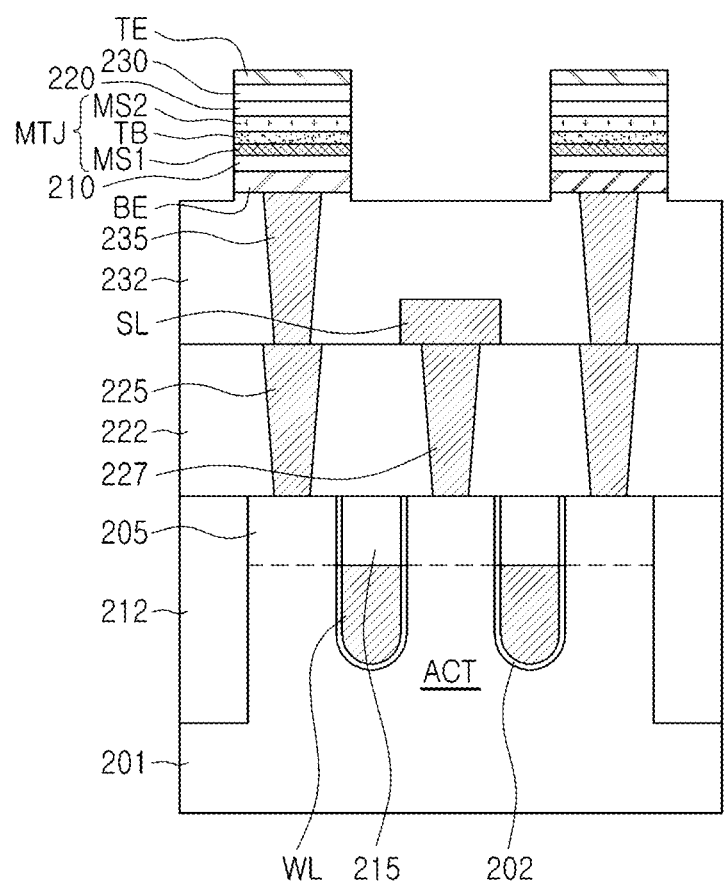

Referring to FIG. 10B, patterning layers constituting the memory element ME may be sequentially patterned to form memory element patterns. The patterning process may be performed by, e.g., dry etching.

In detail, the patterning process may be performed by an ion beam etching process or a reactive ion etching process. During such an etching process, an upper surface of the second interlayer insulating layer 232 exposed between the memory element patterns may be recessed. The memory element patterns are illustrated as having an etching profile in which a cross-sectional width is constant, but the present disclosure is not limited thereto.

Figure 10C:
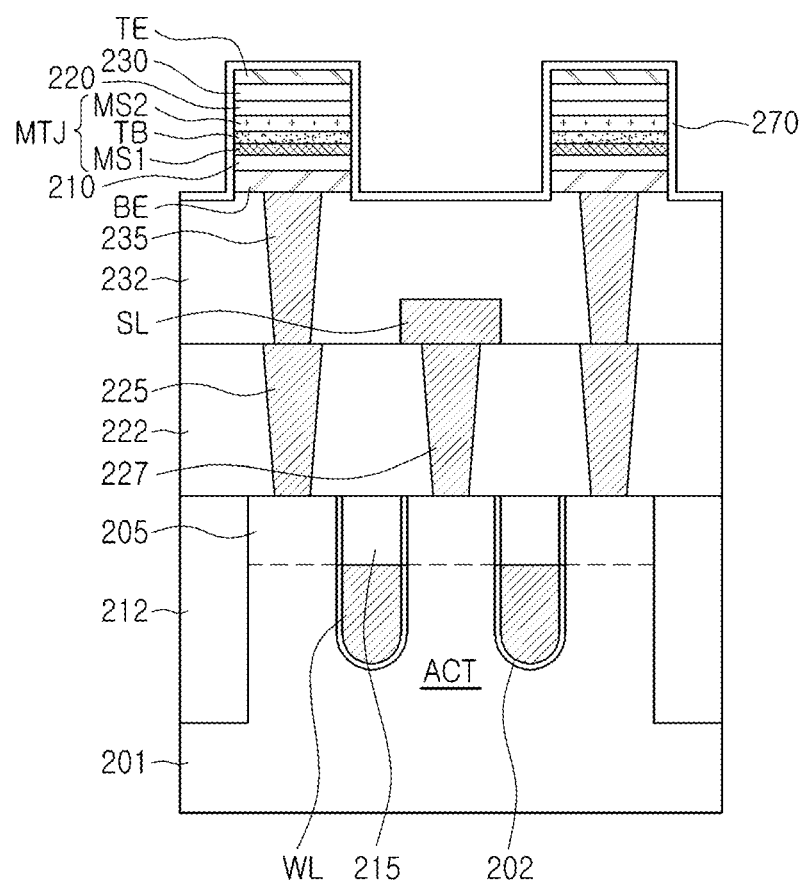

Referring to FIG. 10C, a passivation layer 270 may be formed to cover the memory device patterns and the second interlayer insulating layer 232. The passivation layer 270 may include, e.g., a metal oxide formed by oxidizing metals included in the memory element patterns. The passivation layer 270 may be formed by an oxidation process, a chemical vapor deposition (CVD) process, or the like. Oxidation of the first and second magnetic layers MS1 and MS2 may be prevented by the passivation layer 270.

Figure 10D:
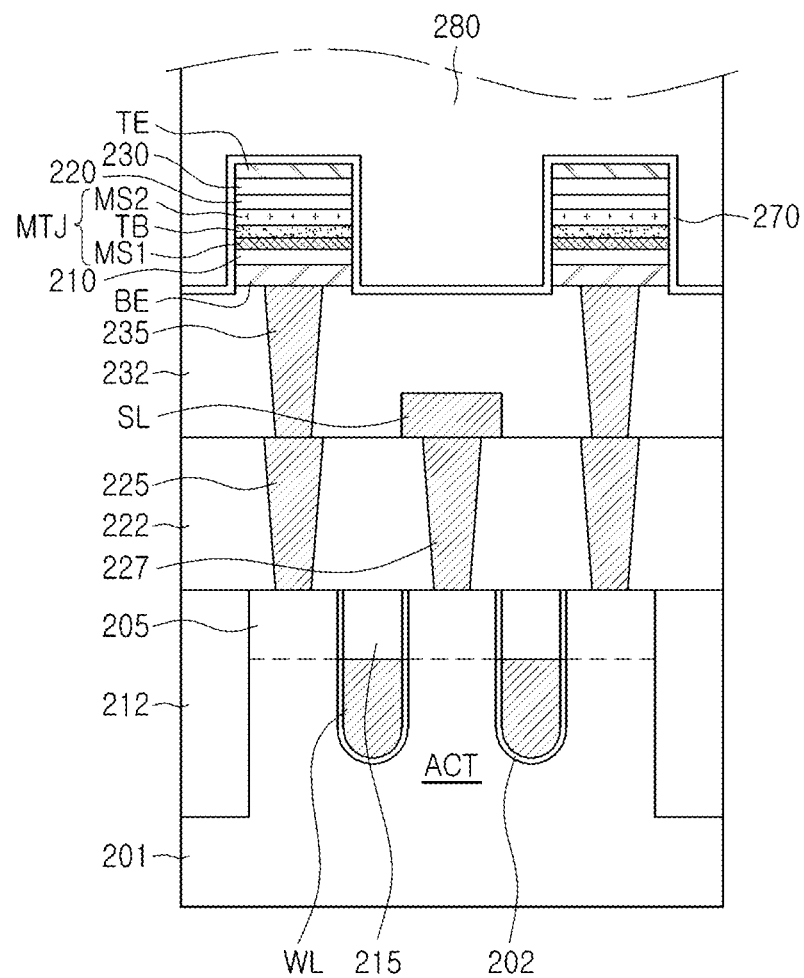

Referring to FIG. 10D, a separation insulating layer 280 may be formed on the passivation layer 270 to fill an entire space between the memory element patterns. The separation insulating layer 280 may be formed of the same or similar material as the first interlayer insulating layer 222.

Figure 10E:
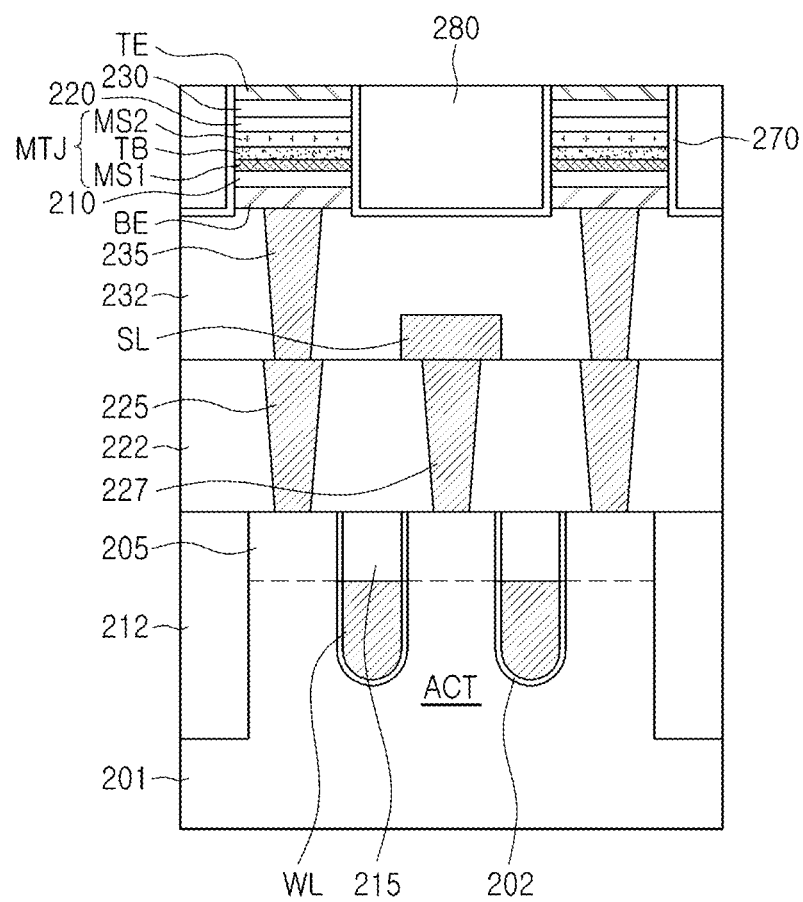

Referring to FIG. 10E, a planarization process may be performed to remove portions of the separation insulating layer 280 and the passivation layer 270. An upper surface of the top electrode TE may be exposed by the planarization process. Due to the planarization process, the upper surface of the top electrode TE and an upper surface of the separation insulating layer 280 may be formed to have substantially the same height. In this case, the top electrode TE may serve as an etch-stop layer.

Figure 10F:
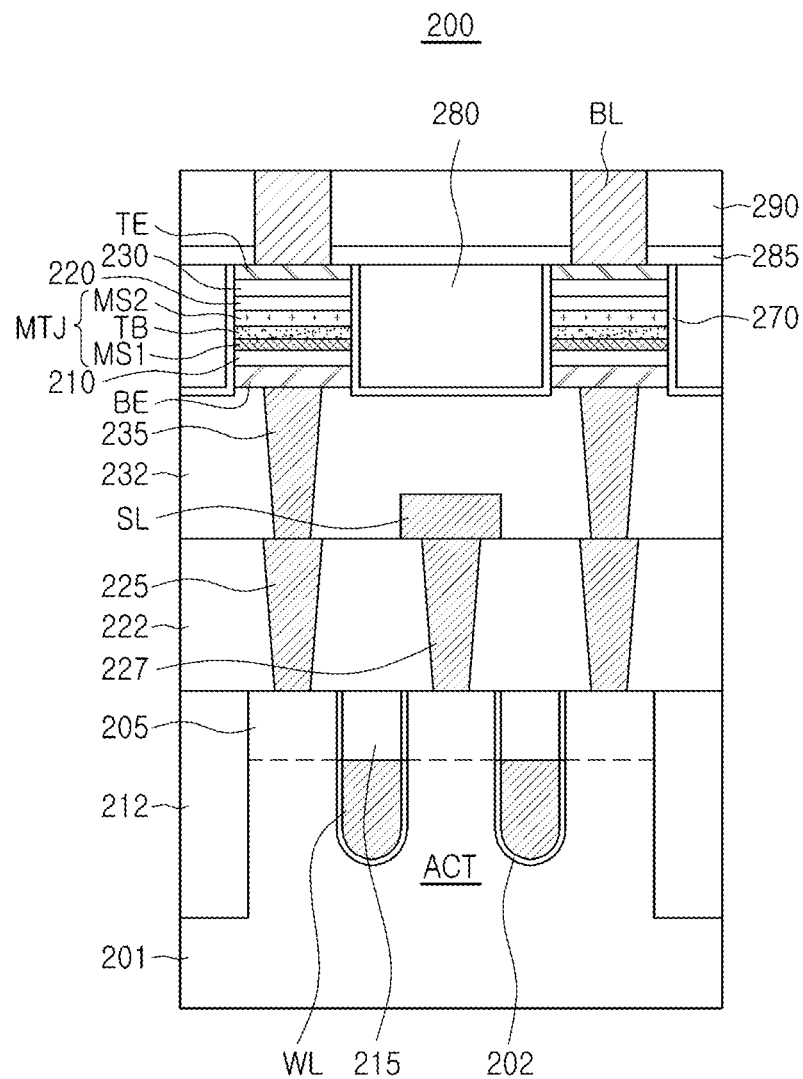

Referring to FIG. 10F, an upper capping layer 285 and a third interlayer insulating layer 290 may be sequentially formed to cover the upper surfaces of the separation insulating layer 280 and the top electrode TE, and the bitlines BL may be formed. The bitlines BL may be formed by etching portions of the upper capping layer 285 and the third interlayer insulating layer 290 such that linear openings are formed to expose the top electrode TE and then depositing a conductive material on the openings. A level of an upper surface of the bitline BL and a level of an upper surface of the third interlayer insulating layer 290 may be the same. The bitlines BL may be formed of a metal having low resistivity and may include, e.g., copper (Cu). Ultimately, a magnetic memory device 200 including the magnetic tunnel junction layer MTJ may be manufactured by the present operation.

By way of summation and review, in a manufacturing apparatus, a decrease in productivity may occur due to travel time and standby time between process chambers in which a plurality of thin films are formed. As a method of analyzing the efficiency of such a manufacturing apparatus, unit per equipment hour (UPEH) has been used in an apparatus for manufacturing a semiconductor device.

Example embodiments provide an apparatus for manufacturing a semiconductor device having improved process efficiency. That is, as described above, an apparatus for manufacturing a semiconductor device may include process chambers and transfer chambers arranged in consideration of process times to improve process efficiency. For example, process chambers having lengthy process time are arranged in parallel, e.g., to perform simultaneously a same operation on different wafers, to decrease overall process times, and a process path and a return path are configured to be different from each other to improve efficiency of the apparatus.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An apparatus for manufacturing a semiconductor device, the apparatus comprising:
   process chambers arranged in a first row and a second row, all the process chambers being in the first and second rows, and the process chambers including:
      a first process chamber, a second process chamber, and a third process chamber arranged in the first row in a first direction; and
      a fourth process chamber, a fifth process chamber, and a sixth process chamber arranged in the second row in the first direction, the fourth process chamber, the fifth process chamber, and the sixth process chamber being spaced apart from the first process chamber, the second process chamber, and the third process chamber, respectively, in a second direction intersecting the first direction,
   wherein the first process chamber is configured to deposit a first magnetic layer of a magnetic memory element,
   wherein the second process chamber and the fifth process chamber are configured to perform a first same process to deposit a tunnel barrier of the magnetic memory element,
   wherein the third process chamber and the sixth process chamber are configured to perform a second same process to deposit a second magnetic layer of the magnetic memory element, and
   wherein the fourth process chamber is configured to deposit a capping layer of the magnetic memory element;
   at least one load-lock chamber at one side of the first to sixth process chambers in the first direction, the at least one load-lock chamber configured to receive a semiconductor substrate transferred to the first to sixth process chambers or transferred from the first to sixth process chambers;
   transfer chambers arranged between the first row and the second row, all the transfer chambers being between the first and second rows, and the transfer chambers including:
      a first transfer chamber, a second transfer chamber, and a third transfer chamber arranged in a third row in the first direction, the third row being between the first row and the second row,
   wherein the first transfer chamber is directly connected to the second transfer chamber, the at least one load-lock chamber, the first process chamber, and the fourth process chamber,
   wherein the second transfer chamber is directly connected to the third transfer chamber, the first process chamber, the second process chamber, the fourth process chamber, and the fifth process chamber,
   wherein the third transfer chamber is directly connected to the second process chamber, the third process chamber, the fifth process chamber, and the sixth process chamber; and
   a controller configured to control the apparatus to, in order:
      carry the semiconductor substrate from the at least one load-lock chamber to the first transfer chamber and from the first transfer chamber to the first process chamber,
      in the first process chamber, deposit the first magnetic layer of the magnetic memory element on the semiconductor substrate,
      carry the semiconductor substrate from the first process chamber to the second transfer chamber and from the second transfer chamber to the second process chamber,
      in the second process chamber, deposit the tunnel barrier of the magnetic memory element on the semiconductor substrate,
      carry the semiconductor substrate from the second process chamber to the third transfer chamber and from the third transfer chamber to the third process chamber,
      in the third process chamber, deposit the second magnetic layer of the magnetic memory element on the semiconductor substrate,
      carry the semiconductor substrate to the fourth process chamber,
      in the fourth process chamber, deposit the capping layer of the magnetic memory element on the semiconductor substrate, and
      transfer the semiconductor substrate from the fourth process chamber to the first transfer chamber and from the first transfer chamber to the at least one load-lock chamber.

2. The apparatus as claimed in claim 1, wherein the first transfer chamber is spaced apart from the second transfer chamber in the first direction, the first transfer chamber being configured to directly receive the semiconductor substrate transferred from the second transfer chamber.

3. The apparatus as claimed in claim 2, wherein:
   the first transfer chamber is arranged in a center between the at least one load-lock chamber and the first and fourth process chambers, and
   the second transfer chamber is arranged in a center between the first, second, fourth, and fifth process chambers.

4. The apparatus as claimed in claim 1, wherein the controller is configured to control the first process chamber to operate using a first process time, and to control the second and fifth process chambers to operate using a same second process time, and the second process time is greater than the first process time.

5. The apparatus as claimed in claim 1, further comprising a supplement chamber arranged in the third row together with the first and second transfer chambers.

6. The apparatus as claimed in claim 5, wherein the supplement chamber is inside at least one of the first transfer chamber and the second process chamber.

7. The apparatus as claimed in claim 1, wherein:
the first and second rows are aligned, such that the first and fourth process chambers are aligned with each other in the second direction, and the second and fifth process chambers are aligned with each other in the second direction,
the third row is offset with respect to the first and second rows, such that each of the first, second, and third transfer chambers is misaligned with the first through sixth process chambers in the second direction, and
transfer times in the first and second transfer chambers are substantially the same.

8. The apparatus as claimed in claim 1, wherein the second and fifth process chambers are configured to deposit, as the tunnel barrier, a material including magnesium oxide (MgO), aluminum oxide (AlO), or a combination thereof.

9. An apparatus for manufacturing a semiconductor device, the apparatus comprising:
a first group of process chambers arranged in a first row in a first direction;
a second group of process chambers arranged in a second row in the first direction, the second group of process chambers being spaced apart from the first group of process chambers in a second direction intersecting the first direction;
a load-lock chamber at one side of the first and second groups of process chambers in the first direction, the load-lock chamber configured to receive a semiconductor substrate transferred from the first and second groups of process chambers or transferred to the first and second groups of process chambers;
transfer chambers arranged in a third row in the first direction, the third row being between the first row and the second row, and the transfer chambers respectively being configured to transfer the semiconductor substrate between the first and second groups of process chambers and between the first and second groups of process chambers and the load-lock chamber,
wherein a total number of the transfer chambers equals half of a total number of the process chambers in the first and second groups,
wherein the first group of process chambers includes first, second, third, and fourth process chambers arranged sequentially from the load-lock chamber, and
the second group of process chambers includes fifth, sixth, seventh, and eighth process chambers arranged sequentially from the load-lock chamber; and
a controller configured to control the apparatus to, in order:
carry the semiconductor substrate from the load-lock chamber to the first process chamber,
in the first process chamber, deposit a first magnetic layer of a magnetic memory element on the semiconductor substrate,
carry the semiconductor substrate from the first process chamber to the second process chamber or the sixth process chamber,
in the second process chamber or the sixth process chamber, deposit a tunnel barrier of the magnetic memory element on the semiconductor substrate,
carry the semiconductor substrate from the second process chamber or the sixth process chamber to the third process chamber or the seventh process chamber,
in the third process chamber or the seventh process chamber, deposit a second magnetic layer of the magnetic memory element on the semiconductor substrate,
carry the semiconductor substrate from the third process chamber or the seventh process chamber to the fourth process chamber,
in the fourth process chamber, deposit an oxide layer of the magnetic memory element on the semiconductor substrate,
carry the semiconductor substrate to the fifth process chamber, and
in the fifth process chamber, deposit a capping layer of the magnetic memory element on the semiconductor substrate.

10. The apparatus as claimed in claim 9, wherein portions of the first and second groups of process chambers include respective process chambers that are arranged in parallel in the second direction, the process chambers arranged in parallel to perform a same process simultaneously.

11. The apparatus as claimed in claim 9, further comprising supplement chambers arranged in the third row together with the transfer chambers.

* * * * *